(12) United States Patent
Teraguchi et al.

(10) Patent No.: US 6,521,998 B1
(45) Date of Patent: Feb. 18, 2003

(54) ELECTRODE STRUCTURE FOR NITRIDE III-V COMPOUND SEMICONDUCTOR DEVICES

(75) Inventors: Nobuaki Teraguchi, Kusatsu (JP); Takeshi Kamikawa, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/472,008

(22) Filed: Dec. 27, 1999

(30) Foreign Application Priority Data

Dec. 28, 1998 (JP) ............................................ 10-373477

(51) Int. Cl.$^7$ ............................................ H01L 23/48
(52) U.S. Cl. ........................ 257/745; 257/746; 257/104; 257/109
(58) Field of Search .................. 257/745, 746, 257/747, 76, 104, 109

(56) References Cited

U.S. PATENT DOCUMENTS

| | | | |
|---|---|---|---|
| 5,192,987 A | | 3/1993 | Khan et al. |
| 5,923,052 A | * | 7/1999 | Kim ............................. 257/91 |
| 6,008,539 A | * | 12/1999 | Shibata ....................... 257/745 |
| 6,045,626 A | * | 4/2000 | Yano et al. .................. 117/950 |
| RE36,747 E | * | 6/2000 | Manabe ....................... 257/431 |
| 6,121,127 A | * | 9/2000 | Shibata ....................... 438/604 |
| 6,191,436 B1 | * | 2/2001 | Shibata et al. .............. 257/103 |
| 6,303,459 B1 | * | 10/2001 | Chen .......................... 438/401 |

OTHER PUBLICATIONS

"Low–Frequency Dispersion Characteristics of GaN Hfets" by W, kruppa et al. Electronics Letters Oct. 26th, 1995 vol. 31 No. 22.

"Bias Dependent Microwave Performance ALGan/GaN MODFET's Up to 100 V" by Y.F. Wu et al. IEEE Electron Device Letters, vol. 18, No. 6, Jun. 1997.

* cited by examiner

Primary Examiner—Olik Chaudhuri
Assistant Examiner—Nathan W. Ha
(74) Attorney, Agent, or Firm—Morrison & Foerster LLP

(57) ABSTRACT

In an electrode structure for a nitride III–V compound semiconductor device, a metallic nitride is used as an electrode material. A metallic material of the metallic nitride has a negative nitride formation free energy, and comprises at least one metal selected from a group consisting of IVa-group metals such as titanium and zirconium, Va-group metals such as vanadium, niobium, and tantalum, and VIa-group metals such as chromium, molybdenum, and tungsten.

14 Claims, 8 Drawing Sheets

*Fig.4B* TiN

*Fig.5A* Ti

*Fig.5B* TiN

Fig.6A  Before annealing

Fig.6B  After annealing

*Fig. 7A* Before annealing

*Fig. 7B* After annealing

ELECTRODE STRUCTURE FOR NITRIDE III–V COMPOUND SEMICONDUCTOR DEVICES

BACKGROUND OF THE INVENTION

The present invention relates to an electrode structure for nitride III–V compound semiconductor devices and, more particularly, to a Schottky electrode structure having high adhesion strength and good temperature characteristics.

Figure 9:
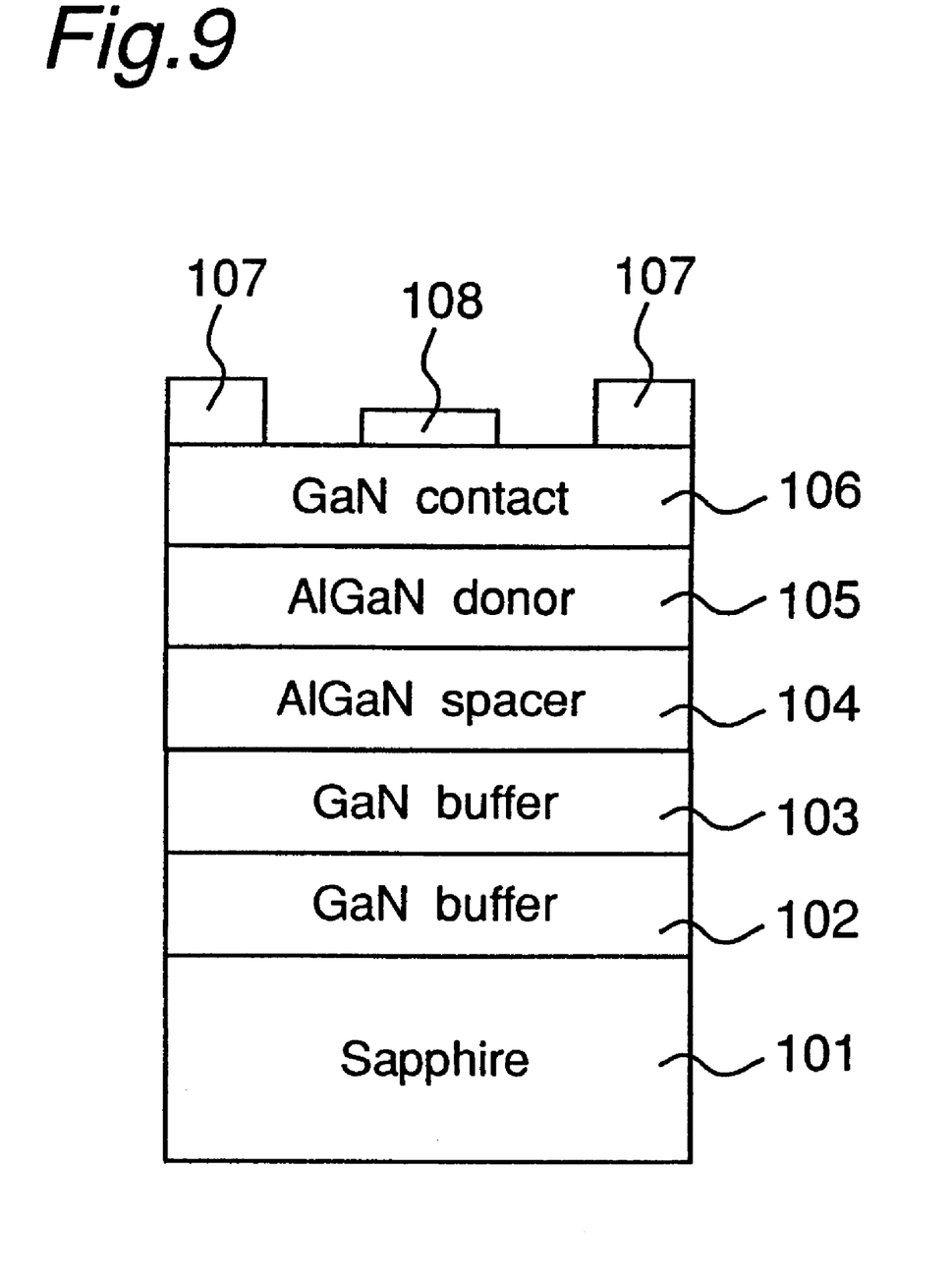
FIG. 9 is a schematic sectional view of the conventional HFET.

A conventional hetero-junction field effect transistor (hereinafter referred to as "HFET") made of nitride semiconductor is generally of such a construction as shown in FIG. 9. As is shown in FIG. 9, the HFET includes a sapphire substrate 101, a low temperature grown GaN (gallium nitride) buffer layer 102 having a layer thickness of 20 nm, and a GaN buffer layer 103 having a layer thickness of 2 $\mu$m and a carrier density of $5 \times 10^{16}$ cm$^{-3}$, the latter two layers being sequentially placed on the substrate. Sequentially stacked on the buffer layer 103 are an AlGaN (aluminum gallium nitride) spacer layer 104 having a layer thickness of 20 nm, an AlGaN donor layer 105 having a layer thickness of 20 nm and a carrier density of $1 \times 10^{18}$ cm$^{-3}$, and a GaN contact layer 106 having a layer thickness of 10 nm and a carrier density of $2 \times 10^{18}$ cm$^{-3}$.

Source/drain electrodes 107, 107 using an ohmic contact, and a gate electrode 108 using the Schottky junction are formed on the GaN contact layer 106.

Generally, metals having a large work function, such as nickel (Ni) (Y.-F. Wu et al, IEEE Electron Device Lett. 18 [1997] 290), platinum Pt (W. Kruppa et al, Electronics Lett. 31 [1995] 1951), and gold Au (U.S. Pat. No. 5,192,987), have been used as Schottky electrode materials for gate electrodes. These metals are ohmic electrode materials relative to p-type semiconductors and are, therefore, used as Schottky electrode materials relative to n-type semiconductors.

However, these metals will show relatively weak adhesion to the semiconductor and, at temperatures of 400 ° C. or more, the metals will give rise to the problem of increased current leaks, with the result that the HFET is very much deteriorated in its characteristics.

SUMMARY OF THE INVENTION

Therefore, an object of the present invention is to provide an electrode structure for nitride III–V compound semiconductor devices, the electrode structure including a Schottky electrode having a high adhesion to a semiconductor and good temperature characteristics.

In order to solve the above object, present inventors made an extensive research and, as a result, it was found that the electrode structure described below would be effective as a solution. This finding led to the present invention.

That is, in nitride III–V compound semiconductor devices, it was found that a nitride o f a metal having a nitride forming negative free energy could provide a Schottky electrode showing a high adhesion to semiconductors and good temperature characteristics. The reason for this is that the formation of the metallic nitride on a nitride semiconductor leads to the formation of a chemical bond through nitrogen atoms, resulting in a stronger bond than prior art semiconductor/metal interfaces.

Therefore, an electrode structure for nitride III–V compound semiconductor devices in accordance with the present invention is characterized in that a metallic nitride is used as an electrode material, a metallic material of the metallic nitride having a negative nitride formation free energy.

The metallic nitride should show a metallic conductivity in order to play a role of an electrode.

As examples of metals having a negative nitride formation free energy and at the same time forming a metallic nitride showing a metallic conductivity, mention may be made of metals included in the IVa, Va, and VIa groups. Such metals are exemplified by titanium (Ti) and zirconium (Zr) belonging to the IVa group, vanadium (V), niobium (Nb) and tantalum (Ta) belonging to the Va group, and chromium (Cr), molybdenum (Mo), and tungsten (W) belonging to the VIa group. Hafnium (Hf) is an exception and use of this material is undesirable because its nitride formation free energy is positive. As Table 1 given below tells, the tabulated data of metals shown indicates that all of the metals show a negative nitride formation free energy. The larger the formation free energy in the negative direction, the better. The reason for this is that the resulting metallic nitride is more stable and, in particular, Zr, Ti, Ta, and Nb having a formation free energy of not more than –50 kcal/mol are preferred.

TABLE 1

| Metal | Melting Point (° C.) | Nitride Form | Nitride Melting Point (° C.) | Formation Free Energy$^{-*}$ (kcal/mol) |
| --- | --- | --- | --- | --- |
| Ti | 1668 | TiN | 2950 | –74 |
| Zr | 1852 | ZnN | 2980 | –87 |
| Hf | 2230 | HfN | 3000 | 81 |
| V | 1887 | VN | 2050 | –35 |
| Nb | 2468 | NbN | 2300 | –51 |
| Ta | 2996 | TaN | 3087 | –54 |
| Cr | 1907 | CrN | 1500 | –24 |
| Mo | 2617 | Mo$_2$N | — | –12 |
| W | 3407 | W$_2$N | — | –11 |

*"Structure and Properties of Inorganic Solids" by F. S. Galasso (1970), Pergamon Press Inc.

The metal material for these metallic nitrides may be a single metal or a composite metal comprised of two or more kinds of metals. These metals have a high melting point and, accordingly, nitrides of the metals have a high melting point and are thermally stable, being thus able to exhibit good temperature characteristics.

From the standpoint of thermal stability, it is desirable that the melting points of the metals and metallic nitrides be as high as possible, while some correlation can be observed between the melting points of metals and the melting points of metallic nitrides through the formation free energy. That is, in case that even if the melting point of a metal is relatively low, but if its formation free energy is large, the melting point of a nitride of the metal tends to rise. Therefore, from the standpoint of thermal stability, Zr, Ti, Ta, Nb are preferred.

For depositing such a metallic nitride, various methods, such as molecular beam epitaxy using a nitrogen radical and a reactive sputtering method, can be employed.

A suitable thickness range of the metallic nitride layer formed in this way is not less than 10 nm but not more than 200 nm. If the thickness of the metallic nitride is less than 10 nm, the metallic nitride layer does not form a continuous layer, and this poses a problem that no satisfactory reproducibility could be obtained with respect to the characteristics of the metallic nitride layer. On the other hand, the thickness of the metallic nitride which is more than 200 nm will cause a problem of deterioration of the electrical characteristics and crystallinity of a GaN semiconductor layer due to the stress of the metallic nitride layer.

Further, in order to facilitate bonding of lead wire onto the metallic nitride layer, a layer comprised of Au or an Au alloy may be placed on the metallic nitride layer. The Au alloy is not particularly limited; as long as it is superior to Au in hardness, the alloy is acceptable. As a method of depositing Au or an Au alloy, vacuum deposition and sputtering may be mentioned, but are not limitative. By depositing Au or an Au alloy on the metallic nitride, it is possible to reduce the contact resistance of a contact portion between the electrode and the lead wire and hence generation of heat from the contact portion to thereby further improve the characteristics of the electrode.

Thus, a schottky electrode having high film adhesivity and a good temperature characteristic can be obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Preferred embodiments of the invention will now be described in detail with reference to the accompanying drawings.

First Embodiment

Figure 1:
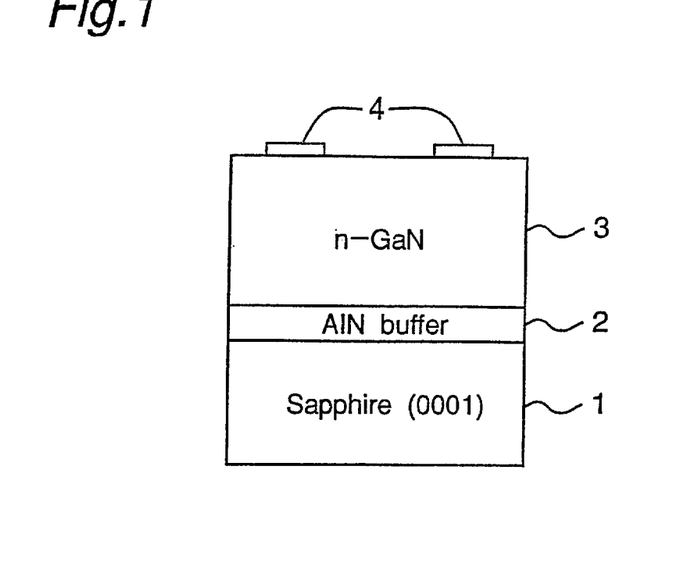
FIG. 1 is a schematic sectional view of a nitride III–V compound semiconductor device having a first embodiment of the electrode structure of the present invention.

FIG. 1 schematically shows the construction of a semiconductor device having an electrode structure according to a first embodiment of the invention. The semiconductor device has a (0001) sapphire substrate 1, a low temperature grown AlN (aluminum nitride) buffer layer 2 formed on the substrate 1 and having a thickness of 20 nm, an n-type GaN layer 3 formed on the buffer layer 2 and having a carrier density of $2 \times 10^{18}$ cm$^{-3}$ and a layer thickness of 1 μm, and ZrN (zirconium nitride) electrodes 4 formed on the n-type GaN layer 3.

In the electrode structure of the present embodiment, the ZrN electrodes 4 were formed by the reactive sputtering process. This process was carried out in the following way.

First, with zirconium (Zr) used as a target, the flow rate of argon gas and the flow rate of nitrogen gas were set to 30 sccm and 12 sccm respectively, and sputtering was carried out at the power of 70 W. Thus, a ZrN electrode 4 comprised of a ZrN film having a thickness of 100 nm was formed on the n-type GaN layer 3.

Figure 2:
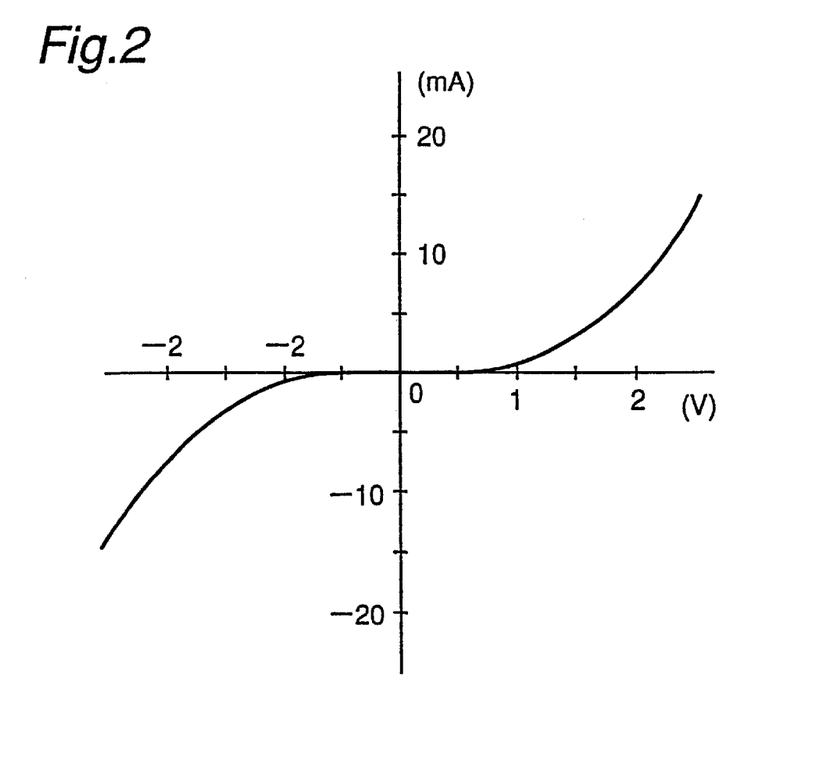
FIG. 2 is an I–V characteristic diagram of a ZrN film of the semiconductor device.

FIG. 2 shows I–V characteristics of the GaN layer 3 after deposition of the ZrN film. As shown in FIG. 2, according to the electrode arrangement of the present embodiment, it is possible to obtain a satisfactory Schottky characteristic of a turn-on voltage on the order of 1.5 V.

Figure 3A:
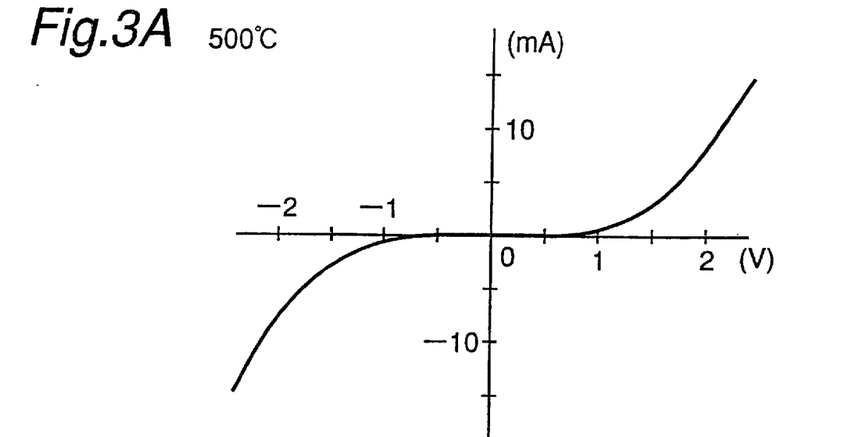
FIGS. 3A, 3B, and 3C are I–V characteristic diagrams of the semiconductor device after annealing at temperatures of 500° C., 643° C., 800° C., respectively.
Figure 3B:
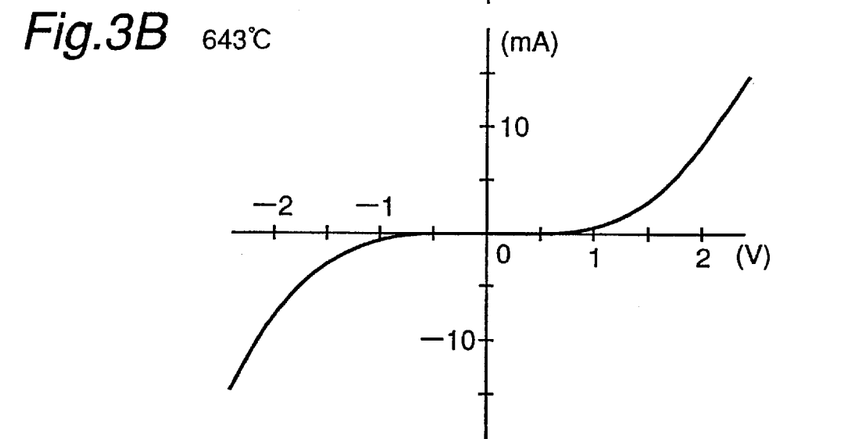
Figure 3C:
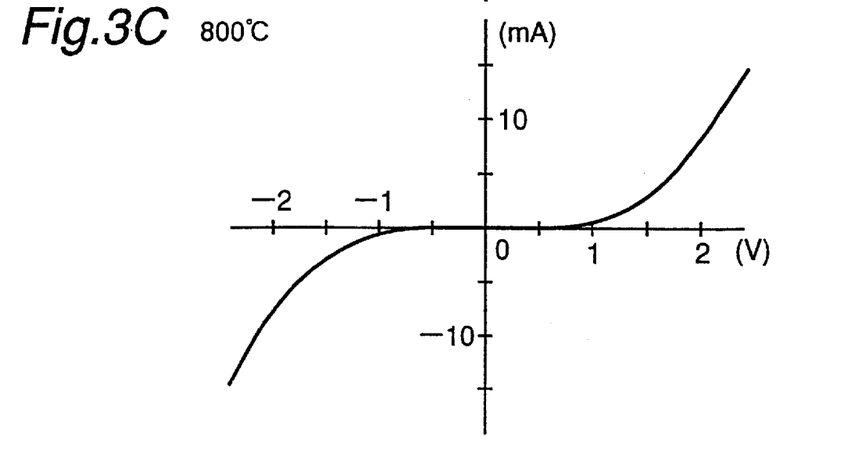

FIGS. 3A, 3B, and 3C show I–V characteristics at annealing temperatures of 500° C., 643 ° C., and 800° C., respectively. As shown in FIGS. 3A, 3B, and 3C., no change was observed among the I–V characteristics at annealing temperatures 500° C., 643° C., and 800° C. (annealing time: 6 minutes each). That is, experiments have proved that the ZrN electrode structure exhibits a thermally stable Schottky characteristic.

Second Embodiment

Next, a second embodiment of the invention will be described. A semiconductor device having an electrode structure of the second embodiment is different from the semiconductor device having the electrode structure of the above described first embodiment only in that the zirconium nitride electrode 4 shown in FIG. 1 was replaced by a titanium nitride (TiN) electrode.

Figure 4A:
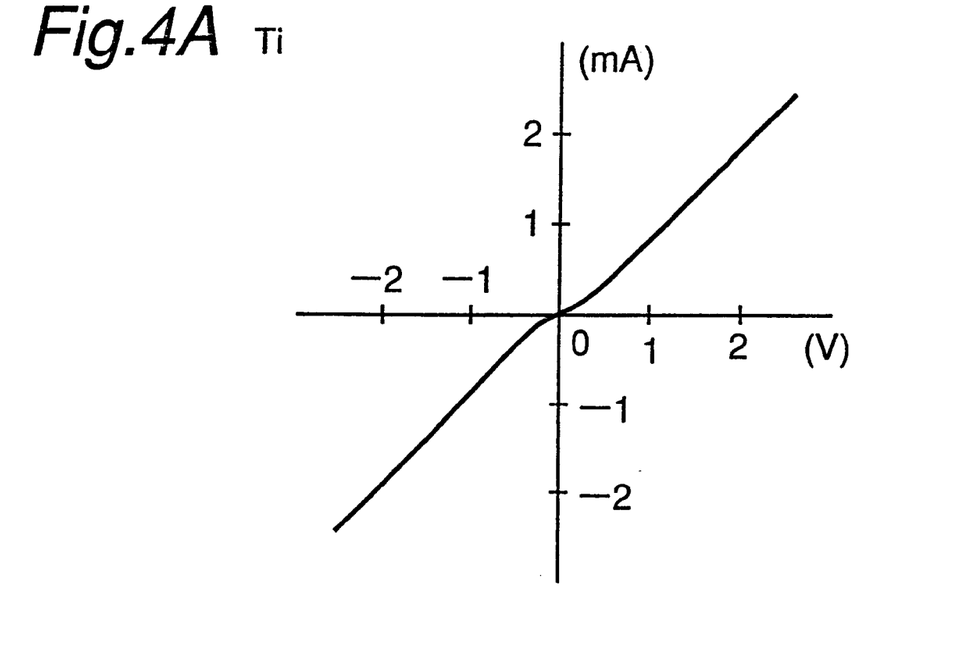
FIGS. 4A and 4B are, respectively, an I–V characteristic diagram of a comparative example in relation to a second embodiment after deposition of a Ti film and before annealing, and an I–V characteristic diagram of the second embodiment after deposition of a TiN film and before annealing.
Figure 4B:
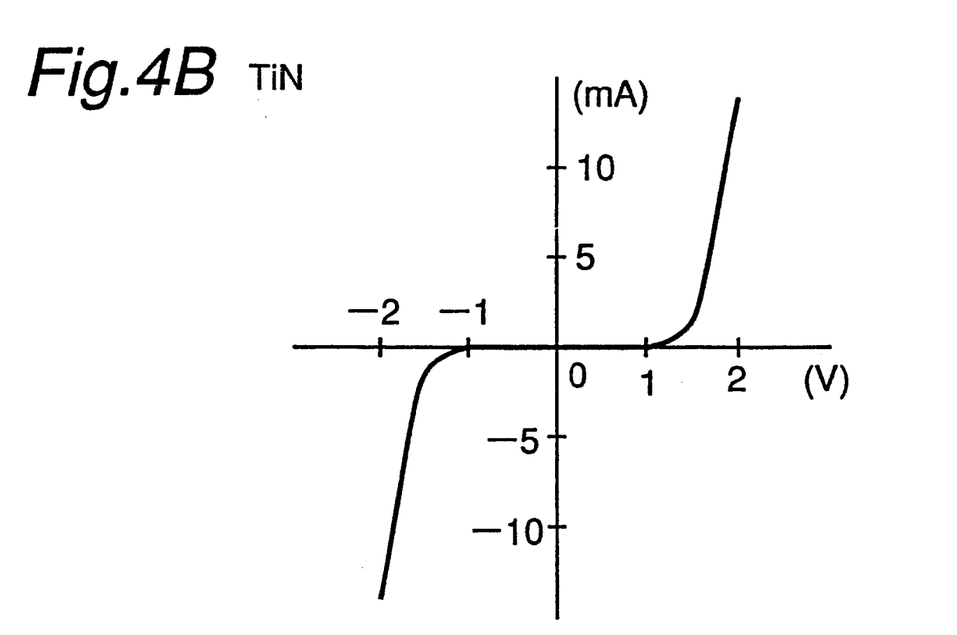

FIG. 4B shows I–V characteristics of the n-type GaN layer 3 of the semiconductor device having a nitride titanium electrode of this second embodiment. The I–V characteristics were measured in the condition of the device prior to annealing, and good Schottky characteristic was witnessed, which showed a turn-on voltage of the order of 1.2 V. FIG. 5B shows I–V characteristic measured after annealing was carried out at 500° C. for 10 minutes. After annealing the n-type GaN layer 3 also showed good Schottky characteristic such that the turn-on voltage was of the order of 1.2 V, which was almost same as the I–V characteristic before annealing.

Figure 5A:
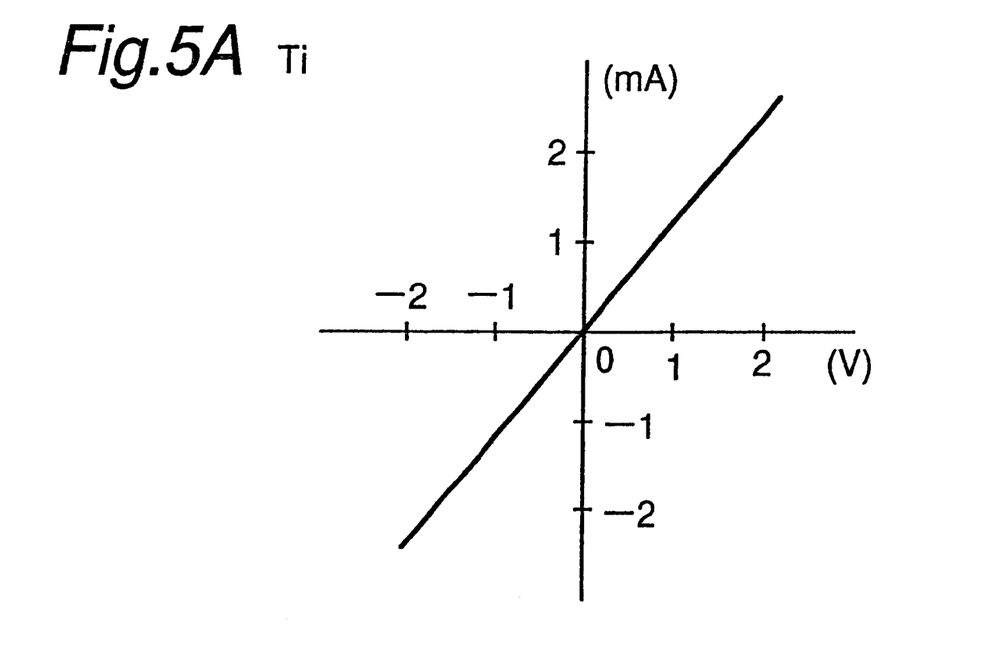
FIGS. 5A and 5B are, respectively, an I–V characteristic diagram of the comparative example after the annealing preceded by the Ti film deposition, and an I–V characteristic diagram of the second embodiment after the annealing preceded by the TiN film deposition.
Figure 5B:
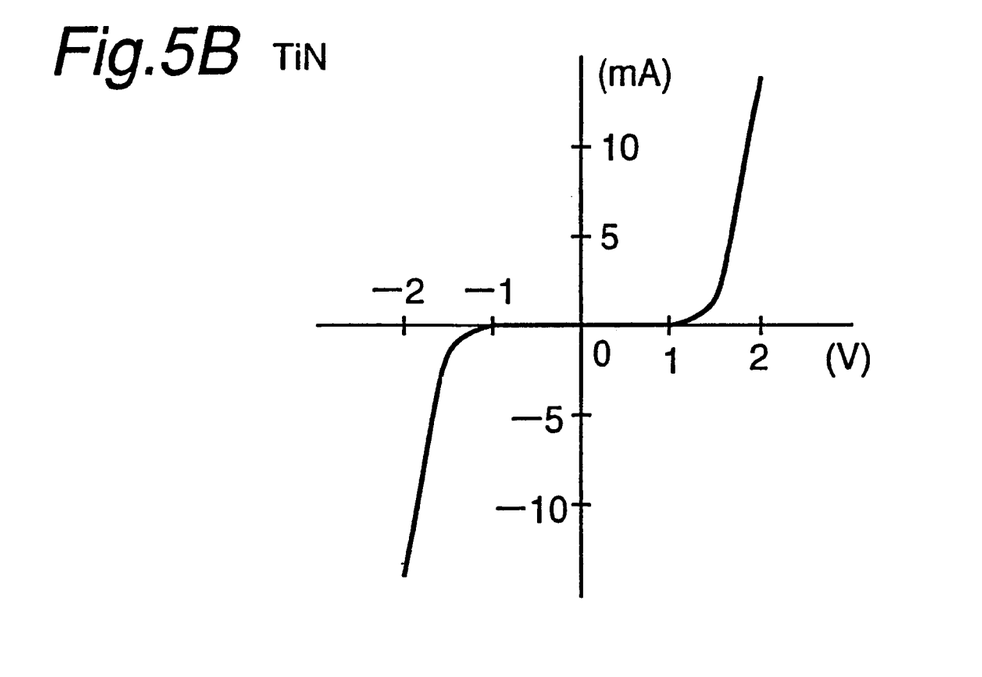

Whilst, as a comparative example in relation to the foregoing example, in FIG. 4A is shown the I–V characteristic of an n-type GaN layer 3 of a semiconductor device including a titanium (Ti) electrode in place of the titanium nitride (TIN) electrode, and in FIG. 5A is shown the I–V characteristic after annealing at 500° C. for 10 minutes.

Where Ti is deposited on the n-type GaN layer in place of TiN, a characteristic having a slight deviation from an ohmic characteristic was observed in the condition after film deposition, as shown in FIG. 4A, but as FIG. 5A shows, a perfect ohmic characteristic was obtained by annealing.

In contrast, according to the present embodiment, as already mentioned, after film or layer deposition, and even after annealing, nearly same good Schottky characteristics were achieved.

The reason for this is explained hereinbelow.

Figure 6A:
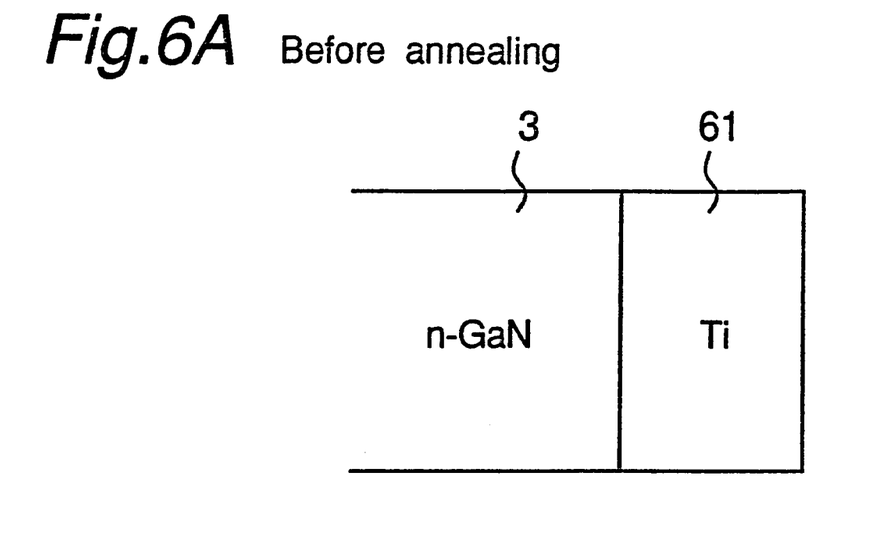
FIGS. 6A and 6B are, respectively, an I–V characteristic diagram of a metal/semiconductor interface structure of the comparative example after the Ti film deposition but before the annealing, and a metal/semiconductor interface structure after annealing the Ti film deposited structure.
Figure 6B:
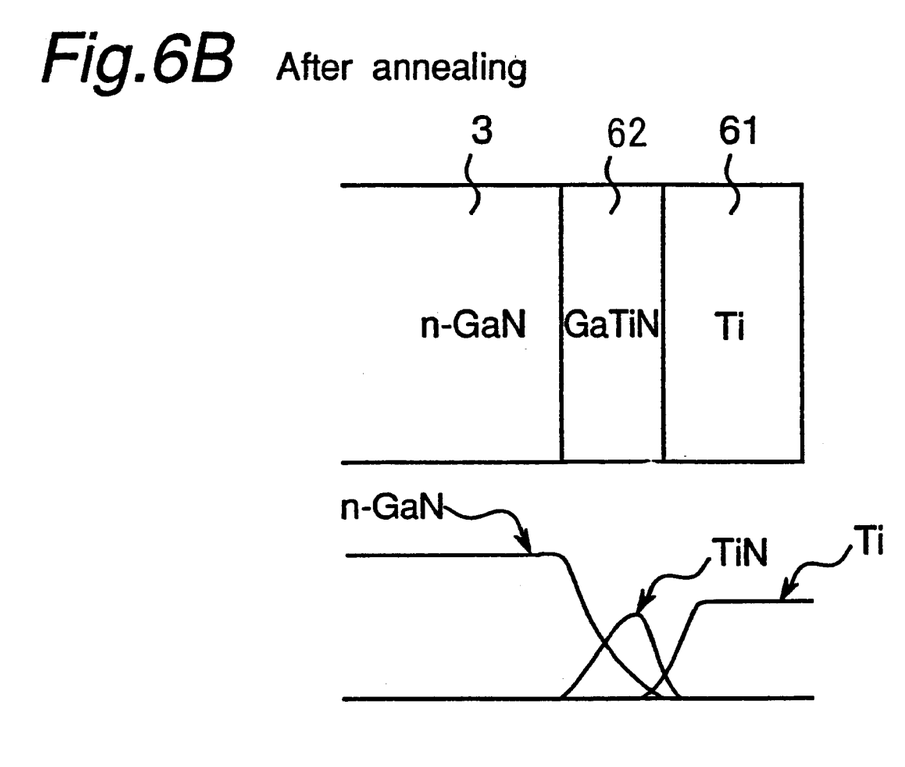

If Ti is deposited on the n-type GaN layer 3 to form a Ti electrode 61, as shown in FIG. 6A corresponding to the comparative example, and then annealing process is carried out, an intermediate layer (GaTiN) 62 is formed at the interface between the n-type GaN layer 3 and the Ti 61, as shown in FIG. 6B, in which the composition continuously changes like GaN/GaTiN/TiN/Ti. By virtue of the presence of the intermediate layer (GaTiN) 62, the ohmic characteristic is obtained.

Figure 7A:
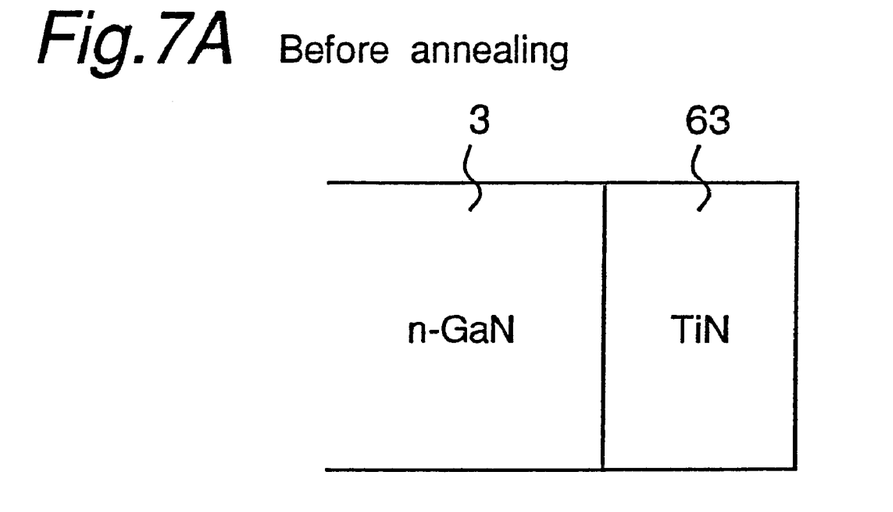
FIGS. 7A and 7B are, respectively, a diagram showing a metal/semiconductor interface structure of the second embodiment after the TiN film deposition but before the annealing, and a diagram showing a metal/semiconductor interface structure after the annealing preceded by the TiN film deposition.
Figure 7B:
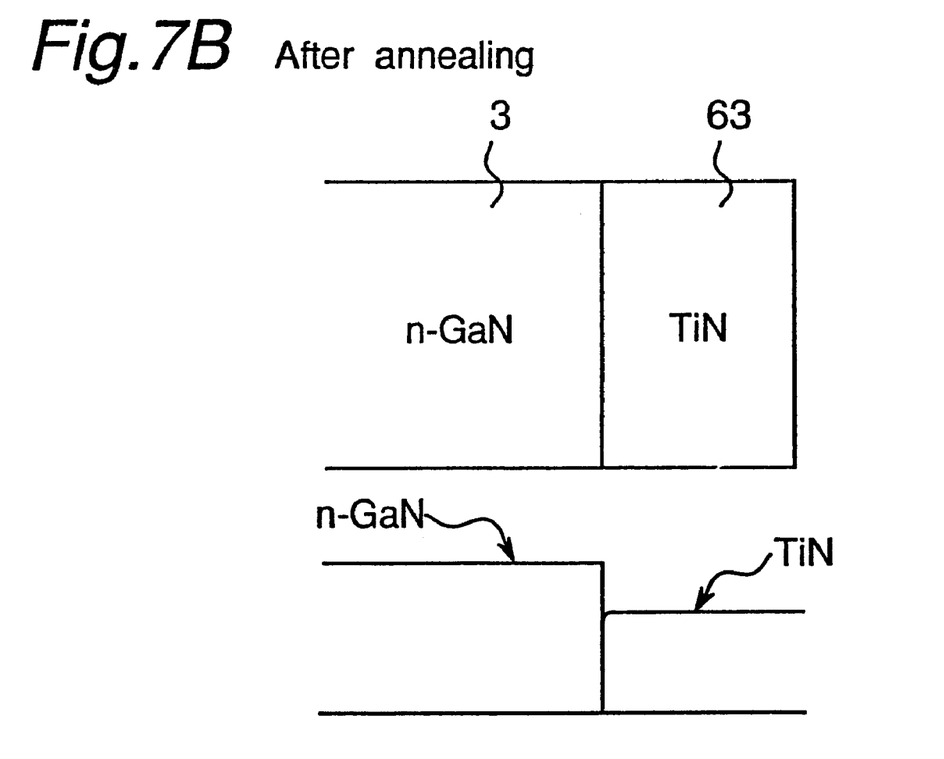

In contrast to the comparative example, when TiN is deposited on the n-type GaN layer 3 as shown in FIG. 7A to form a TiN electrode 63 according to the second embodiment, a steep interface between GaN and TiN is maintained even after the annealing process, as shown in FIG. 7B. By virtue of the presence of the steep GaN/TiN interface, good Schottky characteristics are obtained.

Third Embodiment

Figure 8:
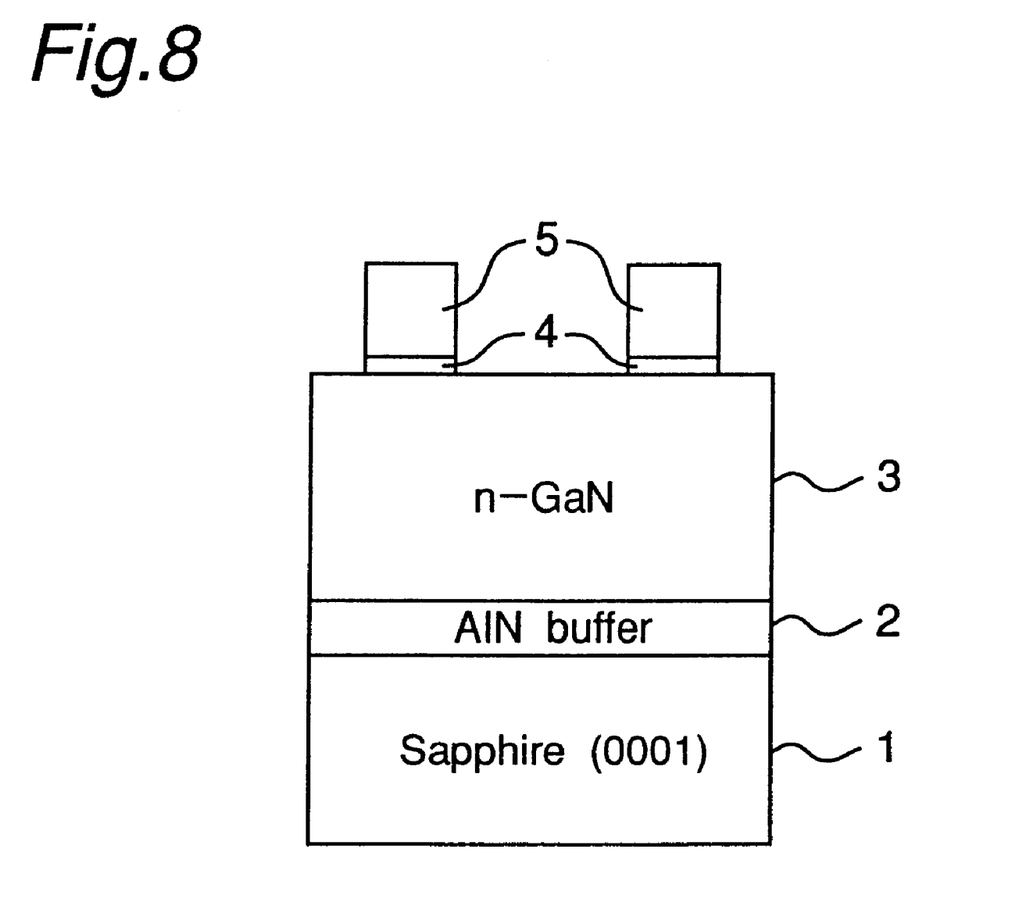
FIG. 8 is a schematic sectional view of a nitride III–V compound semiconductor device having a third embodiment of the electrode structure of the present invention.

Next, the electrode structure of the third embodiment of the invention is described with reference to FIG. 8. The electrode structure of the third embodiment is different from the electrode structure of the first embodiment in that the third embodiment has a layer 5 made of an alloy of gold (Au) on the ZrN film 4. After deposition of the ZrN film 4 on the n-type GaN layer 3 to the thickness of 100 nm, in succession a gold (Au) alloy (AuCr in the present case) is deposited thereon by sputtering process to form the AuCr layer 5. By depositing an Au alloy on a metallic nitride (zirconium nitride in the present case), the contact resistance of the electrode and lead wire can be reduced. Thus, it is possible to minimize heat generation at the contact portion therebetween, resulting in further improvement on the characteristics of the electrode. While a gold alloy (AuCr) is deposited on zirconium nitride in the present embodiment, gold (Au) may be deposited on the zirconium nitride. Further, other gold alloys may be used.

In the first, second and third embodiments, for component metals of the metallic nitride, titanium (Ti) and zirconium (Zr) are used, but where other metals belonging to the IVa, Va, and/or VIa groups, such as niobium (Nb), tantalum (Ta), chromium (Cr), molybdenum (Mo), vanadium (V), and tungsten (W), are used, same effect as in first, second and third embodiments can be obtained.

Test Results

Schottky electrodes were formed using metallic nitrides shown in Table 1 (see the "SUMMARY OF THE INVENTION" column), except Mo and W, and acceleration tests on leak current under reverse bias were carried out. The acceleration tests were conducted under the conditions of 800° C. and 1,000 hours of duration time. Percentages of change in leak current at reverse bias voltage of 50 V are shown in Table 2 below. For the purpose of comparison, percentages of change in the case of Pt and Ni are also shown in Table 2.

TABLE 2

| Electrode Material | Change (%) |
|---|---|
| TiN | 0.5 |
| ZrN | 0.5 |
| VN | 0.9 |
| NbN | 0.5 |
| TaN | 0.4 |
| CrN | 0.9 |
| Pt | 400 |
| Ni | 800 |

Percentages of change in leak current of metallic nitrides were all below 1%, and good thermal stability was witnessed. Whilst, in the case of Pt and Ni, the amount of change was very noticeable, showing they are thermally unstable electrode materials.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electrode structure for a nitride III–V compound semiconductor device, wherein a metallic nitride other than TiN is used as an electrode material, a metallic material of the metallic nitride having a negative nitride formation free energy.

2. The electrode structure as set forth in claim 1, wherein said metallic nitride shows metallic conductivity.

3. The electrode structure as set forth in claim 1, wherein said metallic material comprises at least one metal selected from a group consisting of IVa-group metals, Va-group metals, and VIa-group metals.

4. The electrode structure as set forth in claim 3, wherein said IVa-group metal is zirconium, said Va-group metals are vanadium, niobium, and tantalum, and said, VIa-group metals are chromium, molybdenum, and tungsten.

5. The electrode structure as set forth in claim 1, wherein said metallic nitride is 10 nm to 200 nm in film thickness.

6. The electrode structure as set forth in claim 1, having a film of Au or an Au alloy deposited on the metallic nitride.

7. A nitride III–V compound semiconductor device, comprising:
   a substrate;
   a plurality of layers formed on the substrate, said plurality of layers including a GaN semiconductor layer in an uppermost position; and
   an electrode structure including at least a metallic nitride layer bonded to the GaN semiconductor layer, said metallic nitride layer including no TiN,
   wherein after the semiconductor device has been annealed, there is substantially no layer between the GaN semiconductor layer and the metallic nitride layer so that these layers have a steep interface between them.

8. The nitride III–V compound semiconductor device as set forth in claim 7, wherein a metallic material of the metallic nitride layer has a negative nitride formation free energy.

9. The nitride III–V compound semiconductor device as set forth in claim 8, wherein the metallic nitride shows metallic conductivity.

10. The nitride III–V compound semiconductor device as set forth in claim 8, wherein said metallic material comprises at least one metal selected from a group consisting of IVa-group metals, Va-group metals, and VIa-group metals.

11. The nitride III–V compound semiconductor device as set forth in claim 10, wherein said IVa-group metal is zirconium, said Va-group metals are vanadium, niobium, and tantalum, and said VIa-group metals are chromium, molybdenum, and tungsten.

12. The nitride III–V compound semiconductor device as set forth in claim 8, wherein the metallic nitride layer is 10 nm to 200 nm thickness.

13. The nitride III–V compound semiconductor device as set forth in claim 8, the electrode structure further includes a film of an Au alloy deposited on the metallic nitride layer.

14. An electrode structure for a nitride III–V compound semiconductor device, wherein ZrN, VN, NbN, TaN, CrN, $Mo_2N$ or $W_2N$ is used as an electrode material.

* * * * *